United States Patent [19]
Barber

[11] Patent Number: 4,942,378
[45] Date of Patent: Jul. 17, 1990

[54] HIGH-SPEED SUPERCONDUCTING SWITCH AND METHOD

[75] Inventor: John P. Barber, Dayton, Ohio

[73] Assignee: IAP Research, Inc., Dayton, Ohio

[21] Appl. No.: 358,156

[22] Filed: May 26, 1989

[51] Int. Cl.$^5$ ............................................. H01F 7/22
[52] U.S. Cl. .................................... 335/216; 338/325; 508/1
[58] Field of Search ........................... 335/216; 505/1; 174/125.1; 338/32 S

[56] References Cited

U.S. PATENT DOCUMENTS

| | | | |
|---|---|---|---|
| 3,257,587 | 6/1966 | Krafft | 338/325 |
| 3,324,436 | 6/1967 | Uueller | 338/325 |
| 3,686,458 | 8/1972 | Denel et al. | 335/216 X |
| 3,768,053 | 10/1973 | Massar | 335/216 |
| 3,800,256 | 2/1974 | Garwin | 335/216 |
| 4,336,523 | 6/1982 | Jaggi | 340/825.79 |
| 4,602,231 | 7/1986 | Purcell et al. | 335/216 |
| 4,754,384 | 6/1988 | Levy et al. | 363/14 |

FOREIGN PATENT DOCUMENTS 0292436  5/1988  European Pat. Off. ............ 335/216

OTHER PUBLICATIONS

"Progress Toward a Superconducting Open Switch", D. R. Humphreys, T. L. Francavilla, D. U. Busder, and S. A. Wolf.

"Use of High-Temperature Superconductors in High Speed Electronic Switches with Current Gain", Bryan A. Biegel, R. Singh, Mat. Res. Soc. Symp. Proc., vol. 99, 1988 Materials Research Society.

*Primary Examiner*—George Harris
*Attorney, Agent, or Firm*—Jacox & Meckstroth

[57] ABSTRACT

A high-speed superconducting switch and method. A body of superconductive material has a primary conductive plane through which primary current flows in an electrical circuit. Control current is conducted through the body of superconductive material in a direction which is angular with respect to the primary conductive plane. When control current flows through the body of superconductive material the primary current does not flow through the body, and when the flow of control current ceases, flow of the primary current resumes.

16 Claims, 1 Drawing Sheet

HIGH-SPEED SUPERCONDUCTING SWITCH AND METHOD

BACKGROUND OF THE INVENTION

Numerous materials, known as superconducting materials, are poor conductors when they are not in the superconducting state. In order for such materials to be in a superconducting state, three conditions must be satisfied:
1. The material must be at a temperature below a critical temperature.
2. The density of current flow through the material must be less than a critical magnitude.
3. The magnetic field associated with the material during current flow therethrough must be less than a critical magnitude.

If any of these conditions is not satisfied, the material will not be in a zero resistance state. The critical values for each of these conditions depend upon the material and the manner in which the material is processed.

Numerous switches have been proposed and created for switching a circuit which includes superconducting material. Most of these switches involve one or more of the conditions set forth above.

For example, U.S. Pat. No. 4,602,231 discloses a superconductive wire having a plurality of normal conductive stabilizing segments thereon. A heater is provided which raises the temperature of the superconductive material above its critical temperature to open the switch.

U.S. Pat. No. 4,754,384 discloses apparatus comprising superconductive material having a transition temperature Tc. The apparatus has a plurality of sections. During operation at least one section is maintained at a temperature below the transition temperature. This patent also discloses a switching operation in which a section is superconductive if the current therethrough is less than the critical current.

U.S. Pat. No. 3,800,256 discloses a superconductive switching apparatus in which the temperature of the switch is controlled for operation of the switch.

U.S. Pat. No. 3,768,053 discloses a superconductive switch which changes from a superconductive state to a normal electrically conductive state by changing its intrinsic magnetic field.

U.S. Pat. No. 3,686,458 discloses a switch which has a superconductive element which passes from a superconductive state to a conductor state by application of a pulse of an intense magnetic field.

U.S. Pat. No. 4,336,523 discloses a superconductor switching device in which a magnetizable element is arranged so that a magnetic field surrounds the superconductor. The conductivity of the superconductor is a function of the magnetic field surrounding the conductor.

Patent 3,384,762 pertains to cryogenic switching system for power transmission lines.

Other publications pertaining to superconducting switching are:
Nield & Mawardi, "Characteristics of Very High Currently Capacity Superconducting Switches", Proceedings of the IEEE, Vol. 53, No. 5, May 1965, page 523;
Humphreys, D. R., et al, "Progress Toward a Superconducting Opening Switch," Digest of Technical Papers, Sixth IEEE Pulsed Power Conference, Library of Congress Cat No. 87-83052, IEEE Cat. No. 87CH2522-1, 1987;
Tidman, D. A. and Thio, Y. C., "A Superconducting Opening Switch System," Technical Note 87-6, GT-Devices, Inc., 5705A General Washington Drive, Alexandria VA 22312, Aug. 12, 1987;
Dronov, A. S. Ignatov, V. Y., and Misyulin, A. V., "Performance Study of Inductive Output Cryotronic Converters," IEEE Transactions on Magnetics, Vol. MAG-15, No. 1, January 1979.

It is an object of this invention to provide means and a method for rapidly and effectively switching current flow through a body of superconductive material.

Another object of this invention is to provide switch means and method which can be employed with respect to a superconductor body of any physical size.

Another object of this invention is to provide such means and method which is compact and relatively low cost.

Other objects and advantages of this invention reside in the circuitry and the elements thereof, the combination thereof, and the method and mode of operation, as will become more apparent from the following description.

SUMMARY OF THE INVENTION

Many superconducting materials are anisotropic. Thus, the critical current density through the materials is high only within a primary crystal plane. In this invention the anisotropic nature of the superconducting materials is of value. In a switch of this invention the primary conduction current flows in the primary crystal plane of the superconductor. To provide for high levels of current, several crystal planes are stacked in parallel relationship. Switch control current is directed through the stack in a direction which is angular with respect to the conduction planes. Preferably, but not necessarily the switch control current is directed through the stack in a direction substantially normal to the primary conduction planes.

As an alternative, the current flow along the primary conduction plane is employed to control flow of current through the stack in a direction which is angular with respect to the primary crystal plane. The current gain of the control current with respect to the primary conduction current depends upon the degree in which the material is anisotropic. The current gain also depends upon the magnitude of the primary conduction current with respect to the critical current. The current gain also depends upon the ratio of the primary conduction area to the control conduction area.

DETAILED DESCRIPTION OF THE PREFERRED EMBODIMENT

Figure 1:
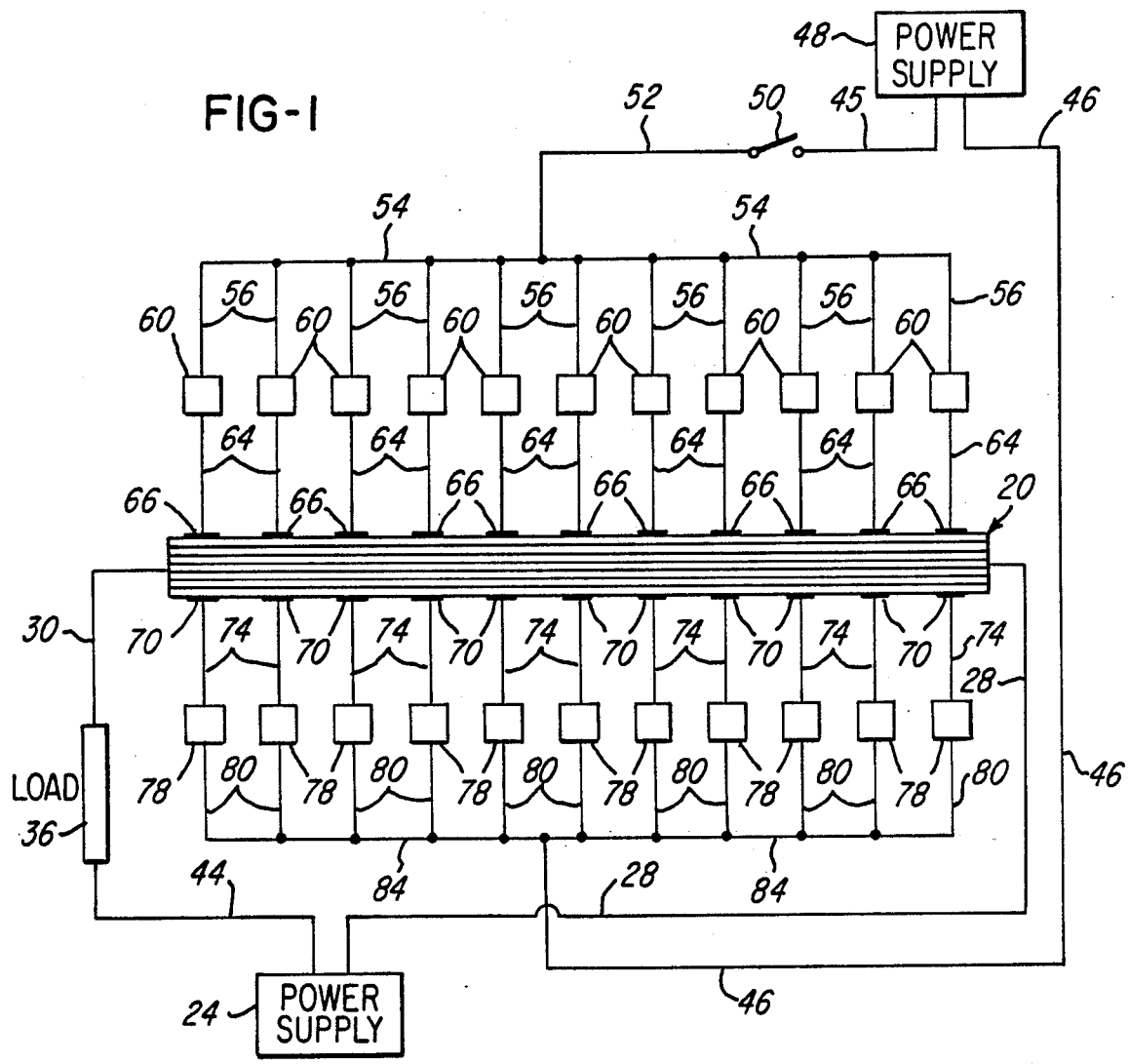
FIG. 1 is a diagrammatic view illustrating structure and circuitry of this invention.

FIG. 1 shows diagrammatically structure and circuitry of this invention. A plurality of planes or layers of superconductive material are arranged in a stack or body 20. The superconductive material in the stack or body 20 is maintained below a transition temperature, and the electrical current therethrough is maintained below a critical current value. Also, the magnetic field within which the superconductive material functions is below a critical value.

A main power supply 24 provides electrical energy to the body 20 of superconductive material. An electrical conductor 30 joins the body 20 of superconductive material to an electrical load 36. An electrical conductor 44 connects the load 36 to the power supply 24.

Control conductors 45 and 46 are connected to a control power supply 48. The conductor 45 is connected to a switch 50. A conductor 52 joins the switch 50 to a bus conductor 54. A plurality of conductors 56 is connected to the bus conductor 54. An impedance element 60 is connected to each of the conductors 56. Each impedance element 60 comprises any suitable or desired impedance unit which, for example, may be a resistance element, or a capacitive element, or an inductance element, or a combination thereof. Each impedance element 60 is connected to a conductor 64, which is also joined to a connector 66. Each connector 66 is attached to a surface of the body 20.

Attached to the opposite surface of the body 20 is a plurality of connectors 70. Each connector 70 has attached thereto a conductor 74. Each conductor 74 is connected to an impedance element 78. Each impedance element 78 may be similar to each impedance element 60. Each impedance element 78 has attached thereto a conductor 80, which is joined to a bus conductor 84. Connected to the bus conductor 84 is the conductor 46.

Primary conduction current flows through the conductors 28, 30, and 44, and through the superconductive body 20 and through the load 36. When it is desired to stop current flow through the superconductive body 20, the switch 50 is closed, and control current flows from the control power supply 48, through the conductors 56, through the impedance elements 60, through the conductors 64, through the body 20, through the conductors 74, through the impedance elements 78 and through the conductors 80, and to the control power supply.

Thus, control current flows through the body 20 in a direction normal to the superconducting plane of the body 20 of superconductive material. In view of the fact that the body 20 is of anisotropic material the body 20 ceases to be superconductive, and current flow therethrough ceases. Thus, primary conduction current flow through the body 20 is switched off by flow of control current through the body 20 in a direction normal to the conduction plane of the material of the body 20.

Flow of primary conduction current through the body 20 is quickly re-initiated by opening the switch 50, so that control current ceases to flow through the body 20.

Figure 2:
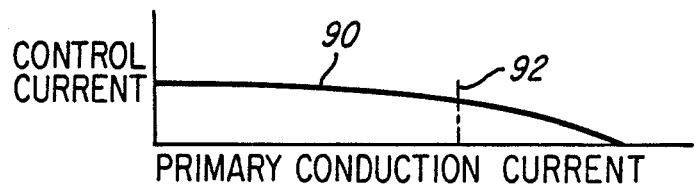
FIG. 2 is a diagrammatic view illustrating the operation of this invention.

FIG. 2 illustrates the operating conditions within the body 20 of superconductive material. The magnitude of control current is expressed in a vertical direction, and the magnitude of the primary conduction current is expressed in the horizontal direction. An envelope 90 encloses a region within which the body 20 of material is superconductive. As illustrated in FIG. 2, as the primary conduction current increases, a lower magnitude of control current is necessary to cause the body 20 to become non-conductive.

Line 92 in FIG. 2 represents a control current having a magnitude which extends above the envelope 90 during flow of primary conduction current having a given magnitude. Thus, the magnitude of the control current represented by the line 92 causes the body 20 to be non-superconductive.

As an alternative, the starting and stopping of current flow through the body 20 along the primary conduction plane may be employed to start and stop current flow through the body 20 in a direction angular with respect to the primary conduction plane.

Thus, it is understood that this invention provides a very effective high speed switching means and method for control of primary conduction current through a body of superconductive material.

Although the preferred embodiment of the structure and method of this invention has been described, it will be understood that within the purview of this invention various changes may be made in the form, details, proportion and arrangement of parts and elements, the combination thereof, and the mode of operation, which generally stated consist in a high-speed superconducting switching within the scope of the appended claims.

The invention having thus been described, the following is claimed:

1. A superconductive switch device comprising a body of superconductive material having a primary current conduction plane within which primary current flows, means for conducting control current through the body of superconductive material in a direction substantially normal to the primary conduction plane, whereby primary current flow in the primary current conduction plane ceases as current flows through the body of superconductive material in a direction substantially normal to the primary conduction plane.

2. The superconductive switch device of claim 1 in which the density of current flowing in the primary conduction plane is of a given magnitude, and in which the density of the control current flowing through the body in a direction substantially normal to the primary conduction plane is less than magnitude of the density of the current flowing in the primary conduction plane.

3. The superconductive switch device of claim 1 in which the body of superconductive material is anisotropic in nature.

4. A superconductive switch device comprising a body of superconductive material provided with a primary current conduction plane, first electrical conductor means, the first electrical conductor means being joined to the body of superconductive material for flow of electrical current through the body of superconductive material along the primary current conduction plane of the body of superconductive material, and second electrical conductor means, the second electrical conductor means being joined to the body of superconductive material for flow of electrical current through the body of superconductive material in a direction substantially normal to the primary conduction plane.

5. The superconductive switch device of claim 4 in which the second electrical conductor means includes electrical impedance means.

6. The superconductive switch device of claim 4 in which the second electrical conductor means includes a plurality of connection elements connected to the body of superconductive material.

7. The superconductive switch device of claim 4 in which the second electrical conductor means includes a plurality of connection elements connected to the body of superconductive material and a plurality of electrical impedance elements, there being an impedance element joined to each of the connection elements.

8. The superconductive switch device of claim 4 in which the body of superconductive material is provided with a plurality of parallel primary conduction planes.

9. A method of controlling current flow through a body of superconductive material which is provided with a primary current conduction plane through which the flow of primary current is maintained at a value less than the critical value and which is maintained at a temperature less than a critical temperature and which is maintained within a magnetic field having less than a critical magnitude, comprising conducting control current through the body of superconductive material in a direction which is angular with respect to the primary current conduction plane, whereby current flow in the primary current conduction plane ceases when control current flows through the body of superconductive material in a direction which is angular with respect to the primary current conduction plane.

10. The method of claim 9 in which the body of superconductive material is anisotropic in nature.

11. The method of claim 9 in which the flow of primary current through the primary current conduction plane is of a given magnitude and in which the control current is of a magnitude which is significantly less than the magnitude of the flow of primary current through the primary current conduction plane.

12. A method of switching electric current comprising providing a body of superconductive material having a primary current conduction plane, connecting the body of superconductive material to a source of electrical energy for flow of primary electric current through the primary current conduction plane of the body of superconductive material, passing control electric current through the body of superconductive material in a direction angular with respect to the primary current conduction plane, whereby flow of primary electric current through the primary current conduction plane of the body of superconductive material ceases when control electric current flows through the body of superconductive material and whereby flow of primary electric current through the body of superconductive material resumes when flow of control electric current through the body of superconductive material ceases.

13. A superconductive switch device comprising a body of superconductive material having a primary conduction plane, first circuit means, the first circuit means being joined to the body of superconductive material for flow of current through the body of superconductive material within the primary conduction plane, second circuit means, the second circuit means being joined to the body of superconductive material for flow of current through the body of superconductive material in a direction which is angular with respect to the primary conduction plane, whereby flow of current through the body of superconductive material and through one of the circuit means controls flow of current through the other circuit means and through the body of superconductive material.

14. A method of switching electric current comprising providing a body of superconductive material having a primary current conduction plane, providing a first electric circuit, connecting the body of superconductive material to the first electric circuit for flow of electric current through the primary current conduction plane of the body of superconductive material, providing a second electric circuit, connecting the body of superconductive material to the second electric circuit for flow of electric current through the body of superconductive material at an angle with respect to the primary current conduction plane, controlling flow of electric current through one of said electric circuits and through the body of superconductive material, whereby flow of current through the body of superconductive material and through the other electric circuit is controlled.

15. An electrical switch device comprising a body of superconductive material provided with a primary current conduction plane, means for conducting primary electrical current through the body of superconductive material along the primary current conduction plane, means for conducting control electrical current through a plurality of portions of the body of superconductive material in a direction substantially normal to the primary current conduction plane, whereby primary electrical current ceases when control electrical current flows through the body of superconductive material and primary electrical current again flows through the body of superconductive material when control current flow through the body of superconductive material ceases.

16. The electrical switch device of claim 13 in which impedance means is connected to each of said portions of the body of superconductive material for flow of current therethrough.

* * * * *